United States Patent
Olkkonen et al.

(10) Patent No.: US 11,194,081 B2
(45) Date of Patent: Dec. 7, 2021

(54) METHOD OF MANUFACTURING A DIFFRACTIVE GRATING

(71) Applicant: Dispelix Oy, Espoo (FI)

(72) Inventors: Juuso Olkkonen, Espoo (FI); Ismo Vartiainen, Espoo (FI); Jussi Rahomäki, Espoo (FI)

(73) Assignee: Dispelix Oy, Espoo (FI)

( * ) Notice: Subject to any disclaimer, the term of this patent is extended or adjusted under 35 U.S.C. 154(b) by 250 days.

(21) Appl. No.: 16/618,182

(22) PCT Filed: May 18, 2018

(86) PCT No.: PCT/FI2018/050369
§ 371 (c)(1),
(2) Date: Nov. 29, 2019

(87) PCT Pub. No.: WO2018/220264
PCT Pub. Date: Dec. 6, 2018

(65) Prior Publication Data
US 2021/0157041 A1    May 27, 2021

(30) Foreign Application Priority Data
Jun. 2, 2017  (FI) ..................... 20175507

(51) Int. Cl.
*G02B 5/18* (2006.01)
*G02B 6/34* (2006.01)
(Continued)

(52) U.S. Cl.
CPC ......... *G02B 5/1852* (2013.01); *G02B 5/1857* (2013.01); *G02B 6/34* (2013.01);
(Continued)

(58) Field of Classification Search
CPC ...... G02B 5/1852; G02B 5/1857; G02B 6/34; G02B 27/0081; G02B 27/0172; G02B 27/0944; G02B 2027/0125
(Continued)

(56) References Cited

U.S. PATENT DOCUMENTS

| 4,850,681 A | 7/1989 | Yamanobe et al. |
| 2004/0055151 A1 | 3/2004 | Obi et al. |

(Continued)

FOREIGN PATENT DOCUMENTS

| CN | 105209244 A | 12/2015 |
| EP | 2664430 A1 | 11/2013 |

(Continued)

OTHER PUBLICATIONS

David: Fabrication of stair-case profiles with high aspect ratios for blazed diffractive optical elements. Microelectronic Engineering, 2000, vol. 53, pp. 677-680.

*Primary Examiner* — Collin X Beatty
(74) *Attorney, Agent, or Firm* — Laine IP Oy

(57) ABSTRACT

The invention relates to a method of manufacturing a diffractive grating. The method comprises providing a first substrate and manufacturing onto the first substrate a first surface profile using temporary grating material. Next, the first surface profile is covered entirely by a layer of final grating material and a second substrate is bonded onto the final grating material. Finally, the first substrate and the temporary grating material are removed for producing on the final grating material a second surface profile, which is a negative of the first surface profile. The invention allows for conveniently producing high quality gratings using e.g. inorganic materials and height and/or fill factor modulation for diffraction efficiency control.

16 Claims, 2 Drawing Sheets

(51) Int. Cl.
*G02B 27/00* (2006.01)
*G02B 27/01* (2006.01)
*G02B 27/09* (2006.01)

(52) U.S. Cl.
CPC ..... *G02B 27/0081* (2013.01); *G02B 27/0172* (2013.01); *G02B 27/0944* (2013.01); *G02B 2027/0125* (2013.01)

(58) Field of Classification Search
USPC ........................................................ 359/566
See application file for complete search history.

(56) References Cited

U.S. PATENT DOCUMENTS

| | | |
|---|---|---|
| 2005/0057789 A1 | 3/2005 | Funada et al. |
| 2006/0029889 A1 | 2/2006 | Wang |
| 2010/0240840 A1* | 9/2010 | Toyama .............. C08F 283/006 525/450 |
| 2016/0161647 A1 | 6/2016 | Masuyama et al. |

FOREIGN PATENT DOCUMENTS

| | | |
|---|---|---|
| JP | 2007328096 A | 12/2007 |
| JP | 2011008172 A | 1/2011 |

* cited by examiner

METHOD OF MANUFACTURING A DIFFRACTIVE GRATING

FIELD OF THE INVENTION

The invention relates to manufacturing of micro- and nanostructures for optical purposes. In particular, the invention relates to manufacturing optically diffractive gratings, which can be used for example in display applications, such as near-to-eye displays.

BACKGROUND OF THE INVENTION

Near-to-eye displays (NEDs) and head-up displays (HUDs) typically involve diffractive gratings to produce a viewable image. Gratings are needed as in-coupling gratings, which couple an image from an image source to a wave guide, as out-coupling gratings, which produce the final viewable image for the user, and as exit pupil expanders (EPEs), which increase the size of the displays exit pupil.

The quality and characteristics of the gratings determine the quality of resulting image. In addition to having distinct and consistent grating lines, in advanced applications it is desirable to be able to control the diffraction efficiency of the grating locally. This can be achieved by varying grating line height or fill factor within the grating, i.e. using height or fill factor modulation. To achieve the largest possible efficiency adjustment range, both height and fill factor should be modulated. Thus, there is a need for robust and cost-effective fabrication methods for diffractive gratings in which diffraction efficiency can be freely controlled, and which are applicable for mass production. Moreover, in some cases non-polymeric materials are needed, which adds process complexity in comparison with direct polymer modulation.

Fabrication of height-modulated elements is generally done by repeating fabrication cycles in which one height is defined within one cycle. In particular, fabrication of micro- and nanostructures with varying heights on a same substrate is difficult especially in the case of inorganic materials that are difficult to process. This generally requires several fabrication cycles with alignment, where each element height is defined separately during one cycle.

This also requires highly optimized and often complicated processing of the material. In order to get vertical side walls in the material, highly anisotropic etching is required in the currently available methods. One known processing method is discussed in C. David, *"Fabrication of stair-case profiles with high aspect ratios for blazed diffractive optical elements"*, Microelectronic Engineering, 53 (2000). Because of the complexity of the method, the yield of this process is low. Moreover, overlay exposure requires lateral placement accuracy in nanometer level, and any deviations from optimal causes losses in optical performance. Particular challenges are faced when both height modulation and fill factor modulation are desired in order to achieve maximum efficiency adjustment range.

Thus, there is a need for novel industry-scale technologies for manufacturing diffractive patterns and in particular such methods that allow for height and/or fill factor modulation for diffraction efficiency control using challenging materials.

SUMMARY OF THE INVENTION

It is an aim of the invention to overcome at least some of the disadvantages of known technology and to provide a novel method for manufacturing diffractive gratings.

The invention is based on avoiding micro- or nanoscale processing of the final grating material by defining the final grating using temporary material on a substrate and over-growth of final grating material thereon. The temporary material is removed after lamination of a new support on the other side of the structure and exfoliation of the original substrate. The surface profile of the temporary material is replicated as a negative to the final grating material.

In more detail, the present method comprises of manufacturing a diffractive grating comprises
  providing a first substrate,
  manufacturing onto the first substrate a first surface profile using temporary grating material,
  covering the first surface profile entirely by a layer of final grating material,
  bonding a second substrate onto the final grating material,
  removing the first substrate, and
  removing the temporary grating material for producing on the final grating material a second surface profile which is a negative of the first surface profile.

In particular, the invention is characterized by what is stated in claim 1.

The invention offers significant benefits.

In the present method the final grating material or set of materials can be chosen freely as it does not need to be processed further. In particular, the material may comprise an inorganic compound. This is because the final profile is completely determined by processing more easily processable materials, such as a resist or a polymer material, when preparing the surface profile of the sacrificial layer. Thus, the final grating material can be applied in one process step using a deposition method that does not require spatial accuracy or control and the surface profile of the sacrificial layer is replicated as a negative to the final grating layer.

The described method allows for simultaneously combining structure height and fill factor modulation for diffraction efficiency adjustment using optical materials, such as inorganic optical materials, having a high refractive index, such as 1.7 or more, in particular 2.0 or more, such as 2.2 or more. Thus the efficiency of the grating can be spatially varied while maintaining high optical quality.

The present method can be well combined with the manufacturing process of diffractive displays. In particular, the second substrate attached to the stack during the process may be the waveguide of the display and the grating manufactured is an in-coupling or out-coupling grating of the display, or alternatively a diffractive exit pupil expander. Optical coupling of the grating and the substrate can be ensured by the bonding process and material choices.

The invention is particularly suitable for manufacturing gratings on waveguide display elements of near-to-eye displays.

The dependent claims are directed to selected embodiments of the invention.

The features of the temporary layer may be line structures suitable for producing one-dimensional gratings or e.g. dot structures suitable for producing two-dimensional gratings.

The surface profile may contain variation in the feature (line) width, i.e. fill factor modulation and/or variation in the feature (line) height, i.e. height modulation. Using both modulation techniques offers maximum adjusting range of diffraction efficiency.

The first surface profile can be manufactured using nanoimprint lithography, electron beam lithography, optical lithography or embossing, whereas the final grating material can be applied using atomic layer deposition, chemical vapor deposition or physical vapor deposition or variants thereof. High refractive index polymer materials can be applied by spin coating, spraying or inkjet printing. Typically, these materials are cured by UV light or heat and they can contain inorganic compounds.

According to some embodiments, the layer of grating material has an even free surface after deposition and the second substrate, which remains part of the final product, is bonded to the even surface.

In some embodiments, the surface of the final grating material layer is processed, such as polished or otherwise smoothened, before application of the second substrate thereon. Improving the smoothness of the surface ensures good contact and bonding between the layers. Alternatively or in addition to that, processing may involve some other kind of preparation of the surface for the purpose of application of the next layer.

The final grating material may comprise inorganic material, such as $Si_3N_4$, $TiO_2$, $SiO_2$, $HfO_2$.

In some embodiments, the final grating material has an index of refraction, which deviates not more than 10% from the index of refraction of the second substrate. In some embodiments, the index of refraction of the final grating material is more than 10%, such as 10-30% higher than that of the second substrate.

In some embodiments, the second substrate is bonded to the grating material using an adhesive layer. As the second substrate and the final grating material are typically rigid materials, an adhesive layer ensures physical and optical coupling of the substrate and the grating. In some embodiments, the adhesive layer has an index of refraction, which deviates not more than 10% from the index of refraction of the second substrate, and, sometimes, also of the final grating material. The final grating material may also have a index of refraction that is more than 10%, such as 10-30% higher than that of the adhesive layer.

In some embodiments, the bonding of the second substrate to the grating material is carried out using physical or chemical bonding.

Next, embodiments of the invention and advantages thereof are discussed in more detail with reference to the attached drawings.

DETAILED DESCRIPTION OF EMBODIMENTS

An exemplary method is described herein that provides feasible means to fabricate micro- and nanostructures with varying structure height (and line width or fill factor) using any desired material that is compliant with the chosen deposition method. In summary, the method comprises filling a mould with possibly varying structure heights and line widths fabricated in or replicated to a sacrificial material. This sacrificial mould is typically on a first substrate, such as a support wafer or a plate. The filling is carried out by vapor deposition using one or more desired materials. The structure with the first substrate is laminated to a second substrate, such as a support plate by e.g. adhesive, physical, or chemical bonding. Next, the original support plate is exfoliated revealing the sacrificial layer. The sacrificial layer is then removed by wet or dry etching method. This results in a negative copy of the original structure in a desired material.

Figure 1A:
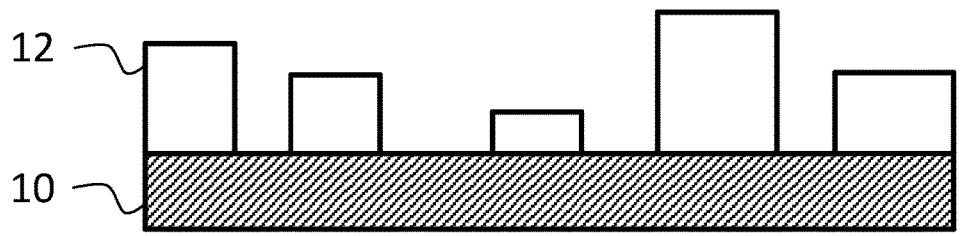
FIGS. 1A-1E illustrate, step by step, in cross-sectional views a structure produced with an exemplary method according to one embodiment of the invention.

In more detail, FIG. 1A shows the first substrate 10 comprising a patterned sacrificial layer 12, which comprises features of different heights and/or widths that form a non-even surface profile to the structure. Herein, the features are rectangular in cross section, but also profiles having non-rectangular angles can be manufacturing using the present method. For example, if a one-dimensional grating is desired, the features can be straight lines having a rectangular or triangular cross section in a plane perpendicular to the line length.

The substrate can be a wafer or any other plate of film structure capable of carrying the sacrificial layer and being separated from the topping layers at a later stage of the process.

The sacrificial layer 12 is manufactured using a temporary grating material, which is also removed in a later stage of the process. The material can be e.g. a resist, polymer, or other patternable and removable thin film material. Patterning can be carried out using nanoimprint lithography, electron beam lithography, optical lithography or embossing, to mention some examples.

In the illustrated example, the first substrate 10 is visible between the protruding features of the sacrificial layer 12, i.e. forms the bottom of the gaps between the features. However, application and patterning of the sacrificial layer can be carried also such that the whole substrate 10 is covered.

Figure 1B:
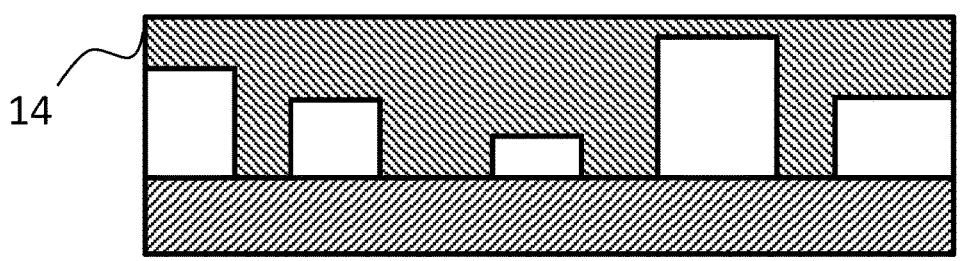

In the next step illustrated by FIG. 1B, the surface profile of FIG. 1A is covered with a layer 14 of desired final grating material, such as an inorganic transparent material. Examples include $Si_3N_4$, $TiO_2$, $SiO_2$ and $HfO_2$. Covering preferably comprises at least filling the grooves of the profile up to the level of the highest feature. Typically the profile is overfilled such the all features of the profile are completely embedded in the layer of final grating material. Preferably, the top surface of the layer is essentially even after this stage.

Atomic layer deposition (ALD), chemical vapor deposition (CVD) or physical vapor deposition (PVD) are all suitable methods for applying the final grating material. UV or heat curable high refractive index polymer materials can be applied by spin coating, spraying or inkjet printing.

After filling the temporary grating structure with the final grating material layer 14, any remaining unevenness of the surface can be polished away using mechanical or chemical polishing or their combination. This ensures good bonding of the grating layer to the second substrate provided in the next step.

Figure 1C:
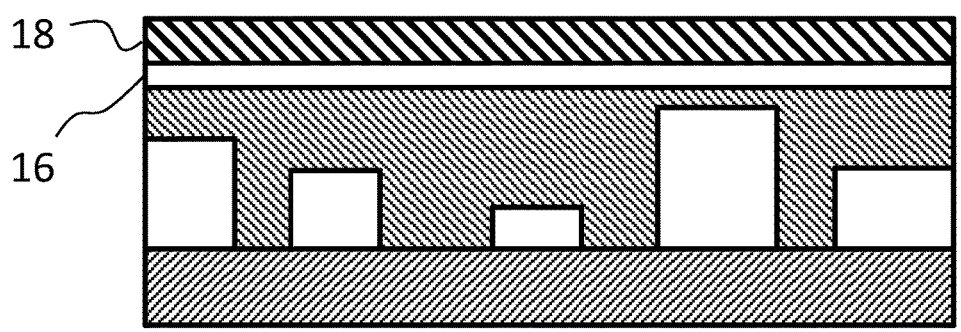

Next, as illustrated in FIG. 1C, a second substrate 18 is attached to the free surface of the final grating layer 14. An adhesive layer or other intermediate layer 16 can be used to ensure bonding of the layers. However, depending on material properties, the layers can also be bonded directly using a suitable physical or chemical bonding method, for example using heat and/or pressure and/or radiation.

Evenness of the top surface of the grating layer 14 ensures good bonding of the second substrate 18 thereto and optical coupling of the layers.

Thus, the second substrate 18, and optionally the adhesive layer 16, are preferably made of transparent materials.

It should be noted that if an adhesive is used, the adhesive material preferably has the same refractive index as the waveguide to improve the optical performance. In near-to-the-eye applications the second substrate can be a high-refractive index material and may act as a waveguide layer. It should also be noted that the final grating material can be chosen such that it has a same refractive index with the second substrate which acts as a waveguide layer, enabling interaction of light incident from the waveguide layer with the modulated layer regardless of any bias layer thickness, i.e. the thickness of any unmodulated layer between the waveguide layer and the modulated grating layer.

Figure 1D:
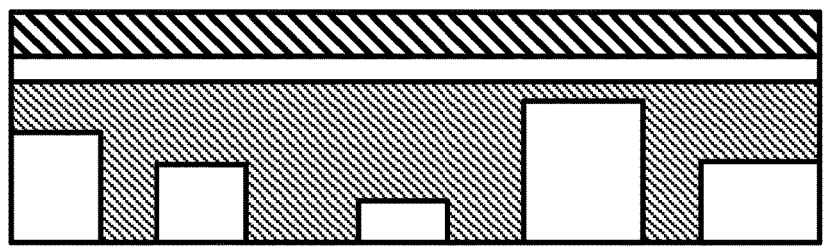
Figure 1E:
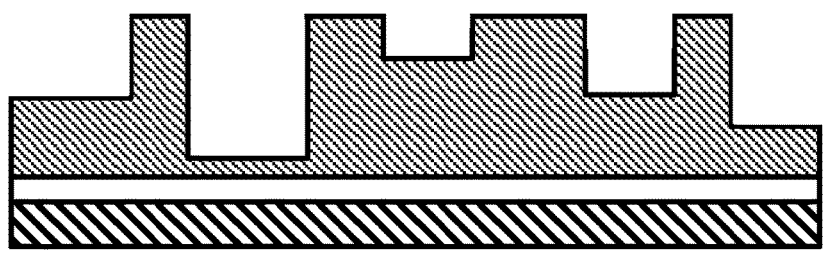

As shown in FIG. 1D, the first substrate 10 is then removed, i.e. exfoliated, from the stack. Consequently, the temporary grating layer 12, and optionally also the final grating layer 14 between the sacrificial material features, is revealed. Depending on the material properties and bonding between the layers, the removal may comprise mechanical, physical or chemical material removal.

Finally, the sacrificial material is removed from the side of the removed first substrate. This results in a negative copy of the original surface profile in the final grating material layer 14 on the second substrate 18. Chemical or physical etching method, which is selective for the sacrificial material can be used.

General Considerations and Variations

The final material may be inorganic transparent material, in particular a metal compound, such as metal oxide or metal nitride. In particular, the final material may comprise material whose index of refraction is 2.0 more, such as 2.2 or more. The material can be e.g. example $TiO_2$, $SiO_2$, $Si_3N_4$ or $HfO_2$.

The second substrate 18, like the optional adhesive layer 16 too, is preferably optically transparent, such as a glass substrate or polymer substrate. Transparent herein means transmittance higher than 50%, in particular higher than 95%. For display applications it is preferred that the substrate is capable of serving as a waveguide for visible optical wavelengths (i.e. as a light guide). The substrate can be planar or curved.

In typical embodiments, the final grating material has an index of refraction higher than that of the second substrate material. This allows for the light travelling in the substrate via total internal reflections to exit the substrate at the location of the grating and the diffraction to take place. For example the, index of refraction of the substrate can be less than 2.0 and the index of refraction of the grating material more than 2.0.

The present invention can be used to manufacture gratings for display applications, such as wearable display applications, for example virtual reality or augmented reality glasses. In these applications, the area of the grating manufactured is typically at least 1 $cm^2$, such as 2-500 $cm^2$.

The diffractive grating may be e.g. an out-coupling grating, an in-coupling grating or an exit pupil expander (EPE) of a near-to-eye display (NED) or head-up display (HUD).

The period of the pattern is typically 10 μm or less, in particular 1 μm or less, such as 200-800 nm. It should be noted that in addition to constant-period gratings, the invention can also be used to produce period modulated gratings. That is, the period does not need to be constant in the lateral dimension of the grating.

If needed, the grating can be embedded in an optical structure, i.e. covered or coated with one or more additional layers.

Figure 2A:
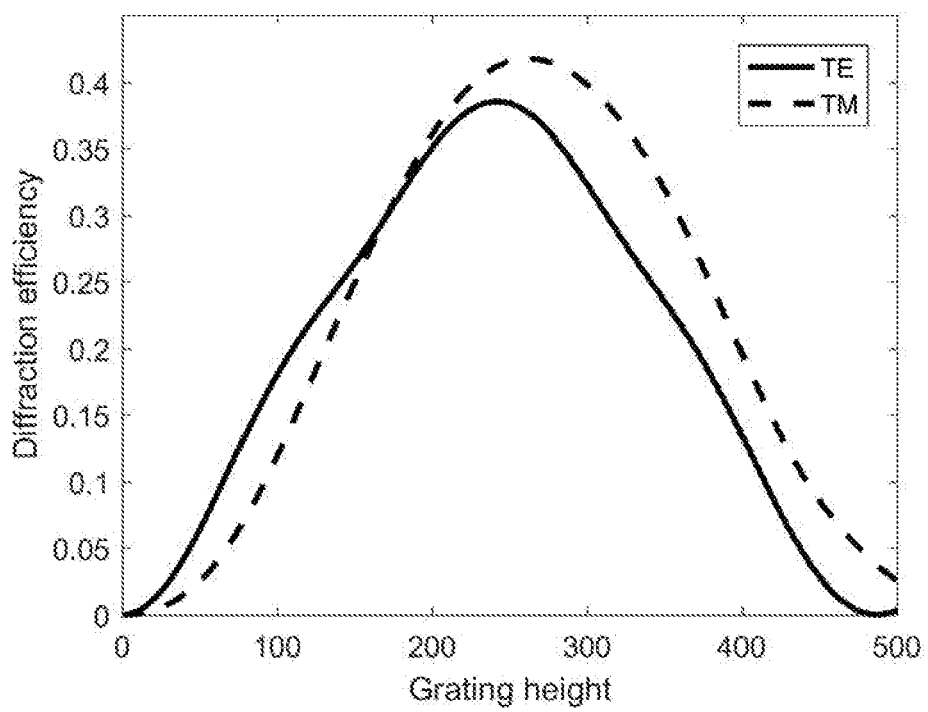
FIG. 2A shows an example how diffraction efficiency of the first transmission order of a binary 1D grating changes as a function of the grating height.
Figure 2B:
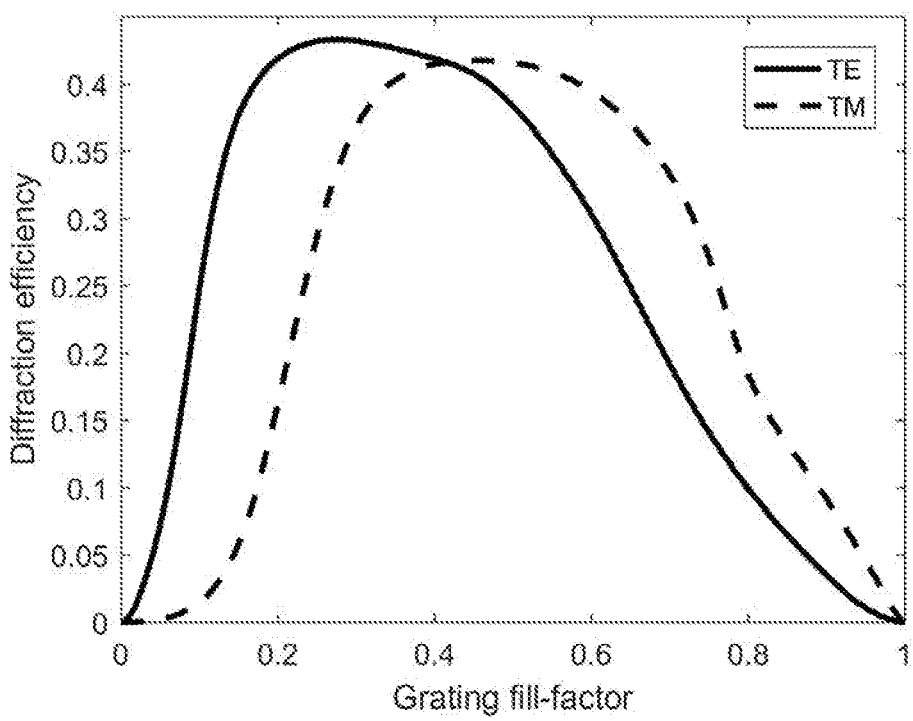
FIG. 2B shows an example how diffraction efficiency of the first transmission order of a 1D grating changes as a function of the grating fill-factor.

FIGS. 2A and 2B show how the diffraction efficiency of the first transmission order of a dielectric binary grating can be modulated using height and fill-factor modulation. Numerical results were obtained with the Fourier modal method (also known as rigorous coupled wave analysis). The binary grating resides on an interface between air and a glass substrate having refractive index of 2.0, the grating period is 500 nm, fill factor 0.5, and the grating is made of the same material as the substrate. The grating is illuminated with a plane wave with 450 nm free space wavelength at normal incidence. Results are shown for both transverse electric (TE) and transverse magnetic polarizations (TM). In FIG. 2A, the grating fill factor is 0.5 and in FIG. 2B, the grating height is 250 nm.

CITATIONS LIST

Non-Patent Literature

C. David, "Fabrication of stair-case profiles with high aspect ratios for blazed diffractive optical elements", Microelectronic Engineering, 53 (2000).

The invention claimed is:

1. A method of manufacturing a diffractive grating, comprising:
   providing a first substrate,
   manufacturing onto the first substrate a first surface profile using temporary grating material,
   covering the first surface profile entirely by a layer of final grating material,
   bonding a second substrate onto the layer of final grating material,
   removing the first substrate, and
   removing the temporary grating material for producing on the final grating material a second surface profile which is a negative of the first surface profile.

2. The method according to claim 1, wherein the first and second surface profile comprise features of different heights for manufacturing a height modulated diffractive grating.

3. The method according to claim 1, wherein the first and second surface profile comprise features of different widths for manufacturing a fill factor modulated diffractive grating.

4. The method according to claim 1, further comprising manufacturing the first surface profile using nanoimprint lithography, electron beam lithography or optical lithography.

5. The method according to claim 1, further comprising applying the grating material using atomic layer deposition, chemical vapor deposition, physical vapor deposition, spin coating, spraying, or inkjet printing or a variant thereof.

6. The method according to claim 1, wherein said layer of grating material has an even free surface after deposition, onto which the second substrate is bonded.

7. The method according to claim 1, wherein the grating material comprises an inorganic material, such as $Si_3N_4$, $TiO_2$, $SiO_2$, $HfO_2$.

8. The method according to claim 1, further comprising bonding the second substrate to the grating material using an adhesive layer.

9. The method according to claim 8, wherein the adhesive layer has an index of refraction which deviates not more than 10% from the index of refraction of second substrate.

10. The method according to claim 1, further comprising bonding the second substrate to the grating material using physical or chemical bonding.

11. The method according to claim 1, wherein the final grating material has an index of refraction which deviates not more than 10% from the index of refraction of the second substrate.

12. The method according claim 1, wherein the final grating material has an index of refraction which is at least 10% higher than the index of refraction of the second substrate.

13. The method according to claim 1, wherein the second substrate is a waveguide or the method further comprises bonding the second substrate onto a waveguide.

14. The method according to claim 13, wherein the waveguide is a waveguide display element of a near-to-eye display.

15. Use of a method of manufacturing a diffractive grating for manufacturing an in-coupling grating, exit pupil expander grating or out-coupling grating of a diffractive waveguide display, wherein the method of manufacturing a diffractive grating comprises:
- providing a first substrate,
- manufacturing onto the first substrate a first surface profile using temporary grating material,
- covering the first surface profile entirely by a layer of final grating material,
- bonding a second substrate onto the layer of final grating material,
- removing the first substrate, and
- removing the temporary grating material for producing on the final grating material a second surface profile which is a negative of the first surface profile.

16. The method according to claim 1, wherein the final grating material has an index of refraction which is 10-30% higher than the index of refraction of the second substrate.

\* \* \* \* \*